(12) United States Patent
Dieny

(10) Patent No.: US 8,624,590 B2
(45) Date of Patent: Jan. 7, 2014

(54) LOW NOISE MAGNETIC FIELD SENSOR USING A LATERAL SPIN TRANSFER

(75) Inventor: Bernard Dieny, Lans en Vercors (FR)

(73) Assignee: Commissariat a l'Energie Atomique, Paris (FR)

( * ) Notice: Subject to any disclaimer, the term of this patent is extended or adjusted under 35 U.S.C. 154(b) by 113 days.

(21) Appl. No.: 13/103,581

(22) Filed: May 9, 2011

(65) Prior Publication Data

US 2011/0215801 A1 Sep. 8, 2011

Related U.S. Application Data

(63) Continuation of application No. 12/123,174, filed on May 19, 2008, now abandoned.

(30) Foreign Application Priority Data

Jul. 10, 2007 (FR) ...................................... 07 56395

(51) Int. Cl.
*G01R 33/09* (2006.01)

(52) U.S. Cl.
USPC ...................................... 324/252; 324/207.21

(58) Field of Classification Search
USPC ............................................ 324/252, 207.21
See application file for complete search history.

(56) References Cited

U.S. PATENT DOCUMENTS

| | | | |
|---|---|---|---|
| 6,532,164 B2 | 3/2003 | Redon et al. |
| 6,603,677 B2 | 8/2003 | Redon et al. |
| 6,686,068 B2 | 2/2004 | Carey et al. |
| 6,707,649 B2 | 3/2004 | Hasegawa et al. |
| 7,738,286 B2 * | 6/2010 | Ito et al. ........................ 365/158 |
| 7,821,748 B2 | 10/2010 | Fukuzawa et al. |
| 7,965,543 B2 * | 6/2011 | Slaughter et al. ............. 365/158 |
| 2002/0024778 A1 | 2/2002 | Xue et al. |
| 2002/0061421 A1 | 5/2002 | Dieny |
| 2005/0041342 A1 | 2/2005 | Huai et al. |
| 2005/0280958 A1 | 12/2005 | Saito et al. |
| 2006/0050446 A1 | 3/2006 | Ishizone et al. |
| 2007/0086120 A1 | 4/2007 | Shimazawa et al. |

(Continued)

FOREIGN PATENT DOCUMENTS

| | | |
|---|---|---|
| JP | A 2006-237154 | 9/2006 |
| JP | A 2007-096105 | 4/2007 |
| JP | A 2007-110011 | 4/2007 |
| JP | A 2007-173476 | 7/2007 |

OTHER PUBLICATIONS

M. L. Polianski, et al., "Current-Induced Transverse Spin-Wave Instability in a Thin Nanomagnet", Physical Review Letters, vol. 92, No. 2, Jan. 16, 2004, XP-002483059, pp. 026602-1-026602-4.

(Continued)

*Primary Examiner* — Reena Aurora
(74) *Attorney, Agent, or Firm* — Oblon, Spivak, McClelland, Maier & Neustadt, L.L.P.

(57) ABSTRACT

A magnetoresistive sensor including: a first pinned-magnetization magnetic layer, called pinned layer; a free-magnetization magnetic layer, called sensitive layer, of which the magnetization, in the absence of an external field, is substantially orthogonal to the magnetization of the pinned layer, the pinned and sensitive layers being separated by a first separating layer for magnetic uncoupling; and a layer, called lateral coupling layer, located on the side of the sensitive layer opposite that of the separating layer, the lateral coupling layer serving to control the lateral spin transfer.

30 Claims, 8 Drawing Sheets

(56) References Cited

U.S. PATENT DOCUMENTS

2009/0015972 A1  1/2009  Dieny et al.
2009/0162698 A1  6/2009  Fukuzawa et al.
2010/0039181 A1  2/2010  Firastrau et al.

OTHER PUBLICATIONS

B. Dieny, "Giant magnetoresistance in spin-valve multilayers", Journal of Magnetism and Magnetic Materials 136 (1994), pp. 335-359.

Neil Smith, et al., "White-noise magnetization fluctuations in magnetoresistive heads", Applied Physics Letters, vol. 78, No. 10, Mar. 5, 2001, pp. 1448-1450.

M. D. Stiles, et al., "Phenomenological theory of current-induced magnetization procession", Physical Review B 69., 054408, (2004), 15 pages.

Japanese Office Action issued in corresponding Japanese application No. 2010-515479 mailed Jan. 29, 2013 (with partial English translation).

* cited by examiner

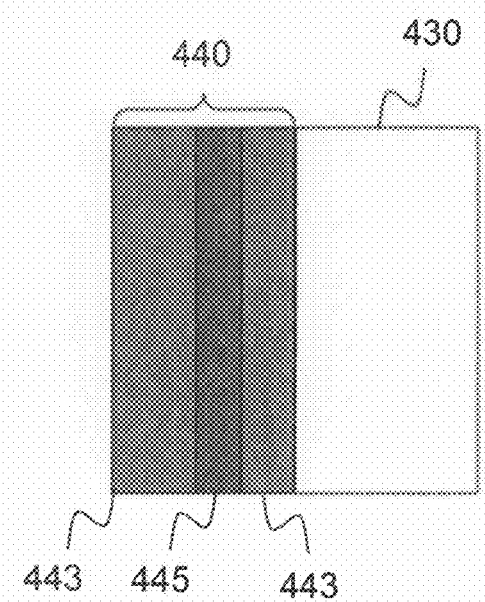 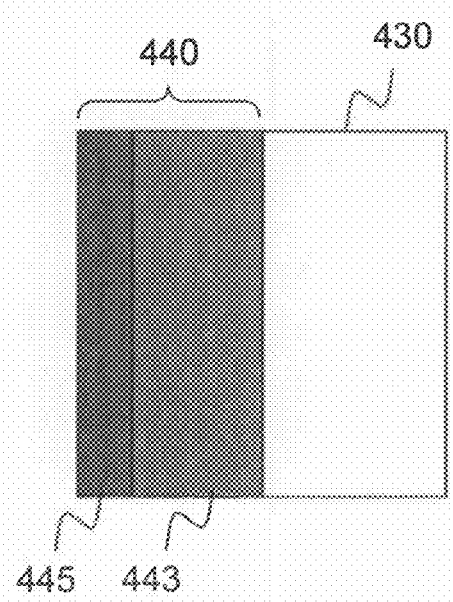
Fig. 5A
Fig. 5B

LOW NOISE MAGNETIC FIELD SENSOR USING A LATERAL SPIN TRANSFER

TECHNICAL FIELD

The present invention relates to the field of magnetic field sensors and more particularly to the field of spin valves, with a current geometry perpendicular to the plane of the layers.

In particular, it has an application in the field of magnetic recording.

PRIOR ART

Magnetic field sensors are used in numerous applications, reading heads for computer hard disks, devices for reading magnetic tracks, magnetic ink, position encoders, shaft position encoders, electronic compasses, etc.

Magnetic field sensors have been the subject of considerable research in recent years, in order to keep pace with the rapid increase in the recording density on hard disks.

Since 1992, the magnetic field sensors used in computer hard disk reading heads are of the magnetoresistive type. In a sensor of this type, the magnetic field variations modify the resistance of a magnetoresistive material, resulting in voltage variations at the terminals of the sensor.

The first magnetoresistive sensors exploited the anisotropy of the magnetoresistance of a magnetic thin layer, that is the dependence of the resistance of such a layer on the angle between the magnetization and the current applied to it.

The latest magnetoresistive sensors are based on spin valves. A spin valve is generally defined as a structure consisting of two magnetic layers separated by a thin layer of nonmagnetic metal. The magnetization of one of the magnetic layers, called the pinned layer, is maintained fixed by exchange interaction with an antiferromagnetic material. The magnetization of the other magnetic layer, called free or sensitive layer, is free to follow the variations in the magnetic field applied to it. The relative variation in orientation of the respective magnetizations of the two magnetic layers induces a change in electrical resistance in the nonmagnetic layer (called the giant magnetoresistance effect). A description of spin valves is found for example in the article by B. Dieny entitled "Giant magnetoresistance in spin-valve multilayers", published in Journ. Magn. Mater. 136, (1994), pp. 335-359.

The first spin valves used a current geometry parallel to the plane of the layers in a configuration called CIP (Current In Plane). The reduction of the size of the bits on the hard disks (about 100 nm×40 nm in 2006) lead to the development of spin valves having a CPP (Current Perpendicular to Plane) configuration having both a higher integration level and a wider variation in magnetoresistance.

According to this configuration, the screens that frame the magnetoresistive element also serve as a power lead and a voltage tap. A description of a spin valve having a CPP configuration can be found in particular in application WO-A-97/44781.

FIG. 1 schematically illustrates a magnetoresistive sensor using a spin valve 100 in a CPP configuration.

The two metal screens 101 and 102 serve to bound the magnetic field measurement zone and as current supply and voltage tap. The width d of this zone gives the maximum read resolution. The spin valve essentially consists of an antiferromagnetic layer 110, a magnetic layer 120 of which the magnetization is pinned by the layer 110, a nonmagnetic thin layer 130, and a magnetic layer 140 of which the magnetization is free to follow the external magnetic field. A bias magnetic field may be applied to the free layer 140 by means of a pair of lateral permanent magnets (not shown) so as to give it a predefined magnetization orientation, in the absence of an external magnetic field.

The resistance of the spin valve is low if the magnetization directions of the free layer 140 and of the pinned layer 120 are parallel, and high in the case in which they are antiparallel. When a magnetic field to be measured is applied in the plane of the layers, this field produces a rotation of the magnetization of the free layer in said plane. The relative orientation of the magnetization of the free layer with regard to that of the thin layer determines the resistance of the spin valve.

Spin valves with a CPP configuration have a very low resistance, due to the low thickness of the layers making them up and their metallic character. In order to produce impedance sensors adapted to the typical input impedance of a preamplifier (a few tens of Ohms), it is possible to use magnetoresistive materials having a high surface resistance (measured in $\Omega \cdot \mu m^2$). For this purpose, it has been proposed to introduce, into the nonmagnetic separating layer, a discontinuous oxide layer designed to locally confine the current paths. However, this approach leads to very high current densities, and hence to electromigration phenomena detrimental to the service life of the sensor. Finally, the most promising technique appears to be the one based on the use of magnetoresistive tunnel junctions or MTJs. An MTJ junction is distinguished from a spin valve with a CPP configuration in that the separating layer 130 is made of an insulating material, for example of alumina or magnesia (MgO).

Another limitation of spin valves derives from the noise affecting the read signal. This arises from various sources. As stated in the article by N. Smith et al. entitled "*White-noise magnetization fluctuations in magnetoresistive heads*", published in Appl. Phys. Lett. 78 (2001), pp. 1148-1150, when a spin valve has a low relative variation in magnetoresistance, that is a low $\Delta R/R$ ratio, where $\Delta R$ is the variation in resistance between the parallel and antiparallel states, the predominant source of noise is of electrical origin, more precisely the Johnson noise resulting from the Brownian motion of the conduction electrons. On the other hand, if this ratio is high, the predominant source of noise is of magnetic origin. In fact, in this case, the fluctuations in magnetization in the sensitive layer can cause wide fluctuations in the resistance of the sensor. These magnetization fluctuations may be caused by the thermal agitation or may result from irreversible movements of the walls or the instability of magnetic domains. For the same dissipated power, the thermal fluctuations are commensurately higher as the size of the sensor is smaller.

In the same way, for an MTJ junction sensor having a low ratio $\Delta R/R$, the predominant source of noise is of electrical origin, that is the shot noise of the tunnel junction, whereas at a high $\Delta R/R$ ratio, the noise is essentially of magnetic origin as stated above.

Thus, for magnetoresistive sensors with spin valves or magnetic tunnel junctions having very high sensitivity (that is having a high ratio $\Delta R/R$) the signal-to-noise ratio (SNR) is essentially conditioned by the noise of magnetic origin.

FIG. 2 shows the typical noise density curve (normalized by $RI^2$ where R is the resistance of the sensor and I the current traversing it) affecting the measurement signal in a magnetoresistive sensor (based on a CPP spin valve or a magnetic tunnel junction) as a function of the frequency f of the measured magnetic field.

A distinction is made between three distinct noise regimes:

In a low frequency zone, denoted zone (I), extending from 0 to a few hundred MHz, the measurement noise is the sum of the white noise, partially of electrical origin (Johnson noise or shot noise) and partially of magnetic origin (thermal magnetization fluctuations in the sensitive layer of the sensor), and a noise in 1/f deriving from an insufficient magnetic polarization of the sensitive layer by the bias magnetic field. In fact, an insufficient polarization can give rise in the sensitive layer to walls likely to shift irreversibly or unstable magnetic domains of which the magnetization may jump during the rotation of the magnetization of the sensitive layer.

In a high frequency zone, denoted zone (III), typically extending from about 1.5 GHz to a few tens of GHz, the shape of the noise curve is due to a ferromagnetic resonance phenomenon or FMR. The thermally activated FMR excitations are naturally amplified when their frequency corresponds to the natural precession frequency of the magnetization of the sensitive layer.

An intermediate zone, denoted zone (II), separates the low and high frequency zones. In this zone, the noise is essentially white, the noise in 1/f and the FMR resonance are virtually absent.

It is consequently the object of the present invention to propose a magnetoresistive sensor structure having very high performance (high sensitivity, small dimensions) while exhibiting a high signal-to-noise ratio in an advantageous frequency range.

SUMMARY OF THE INVENTION

The present invention is defined by magnetoresistive sensor comprising a first pinned-magnetization magnetic layer, called pinned layer, and a free-magnetization magnetic layer, called sensitive layer, of which the magnetization, in the absence of an external field, is substantially orthogonal to the magnetization of the pinned layer, said pinned and sensitive layers being separated by a first separating layer for magnetic uncoupling.

According to a first embodiment, the magnetoresistive sensor further comprises a layer, called lateral coupling layer, located on the side of the sensitive layer opposite that of the separating layer and suitable for backscattering the electrons, with conservation of spin, to the sensitive layer, and also means for circulating a continuous current from the lateral coupling layer to the pinned layer.

According to a first alternative, the separating layer is a first insulating layer, forming a first tunnel barrier.

According to a second alternative, the separating layer is a first discontinuous insulating layer suitable for confining the current passing through it along a plurality of current paths.

According to a third alternative, the separating layer is a first nonmagnetic metal layer.

According to the first or second alternative, the lateral coupling layer may advantageously comprise a second insulating or semiconducting layer forming a second tunnel barrier and having a surface resistivity lower than that of the separating layer.

Alternatively, the lateral coupling layer may comprise a second discontinuous insulating layer suitable for confining the current passing through it and having a surface resistivity lower than that of the separating layer.

The magnetoresistive sensor may further comprise a second metal layer, directly in contact with the sensitive layer, said second metal layer incorporating or being joined to a third metal layer having a higher resistivity than the second metal layer.

According to a second embodiment, the magnetoresistive sensor comprises a lateral coupling layer, located on the side of the sensitive layer opposite that of the separating layer and suitable for reducing the sidescattering of the electrons and/or for producing a loss of spin memory, and also means for circulating a continuous current from the pinned layer to the lateral coupling layer.

According to a first alternative, the separating layer is a first insulating layer, forming a first tunnel barrier.

According to a second alternative, the separating layer is a first discontinuous insulating layer suitable for confining the current passing through it along a plurality of current paths.

According to a third alternative, the separating layer is a first nonmagnetic metal layer.

According to the first or second alternative, the lateral coupling layer may have a high resistivity, such that the mean free path of the electrons in said layer is shorter than the characteristic lateral dimension of the uniform magnetization zones of the sensitive layer.

Alternatively, according to one of the three alternatives, the lateral coupling layer may be a second metal layer having a low resistivity and comprises impurities suitable for causing a spin flip.

The second metal layer may have a lower resistivity than that of the first metal layer.

The first separating layer may consist of alumina, MgO, or $TiO_x$.

The first metal layer may consist of Cu. The second insulating layer may consist of alumina, MgO, $TiO_x$, or a monolayer of TaO.

The second insulating layer may be produced by oxidation of an alloy or of an AlCu bilayer.

The second metal layer may consist of Cu and the third metal layer belongs to the group consisting of Ta, Ru, Cr, Zr, Nb, Mo, Hf, W, Re.

The lateral coupling may consist of Ta, Ru or Cr.

The lateral coupling layer consists of NiFeCr or NiCoFeCr alloy.

The lateral coupling layer may further consist of a lamination of atomic monolayers of Ta and Cu.

The impurities suitable for causing a flip may belong to the group consisting of Mn, Pd, Ru, Pt, Hf, Ta, W, Re, Ir, Pt, Au.

The magnetoresistive sensor according to the first or second alternative may further comprise a synthetic ferrimagnetic layer, consisting of first and second magnetic sub-layers containing an antiferromagnetic coupling sub-layer in a sandwich, the first magnetic sub-layer being pinned by a pinning antiferromagnetic layer, the second magnetic sub-layer constituting said pinned layer.

The synthetic ferrimagnetic layer may be CoFe/Ru/CoFe, where the CoFe magnetic sub-layers have a thickness between 1 and 5 nm and the first Ru antiferromagnetic coupling layer has a thickness of 0.5 to 1 nm.

Alternatively, the synthetic ferrimagnetic layer may be CoFe/Ru/CoFeB or CoFe/Ru/CoFe, where the CoFe and CoFeB magnetic sub-layers have a thickness between 1 and 5 nm and the first Ru antiferromagnetic coupling sub-layer has a thickness of 0.5 to 1 nm and the second magnetic sub-layer consists of CoFeB or CoFe alloy with a face-centered cubic structure.

The pinning antiferromagnetic layer may consist of PtMn, PtPdMn, or IrMn, for example PtMn with a thickness of 15 to 25 nm.

The sensitive layer may consist of CoFe alloy, in particular $Co_{90}Fe_{10}$.

Alternatively, the sensitive layer may consist of two sub-layers, one of Co or CoFe alloy, having a thickness of 0.5 nm to 2 nm, directly at the interface with the separating layer, and the other of NiFe having a thickness of 1.5 to 5 nm.

BRIEF DESCRIPTION OF THE DRAWINGS

Other features and advantages of the invention will appear from a reading of a preferred embodiment of the invention, with reference to the appended figures in which:

FIGS. 5A and 5B schematically show the detail of the magnetoresistive sensor according to two alternatives of a first embodiment of the invention.

DETAILED SUMMARY OF PARTICULAR EMBODIMENTS

The basic idea of the invention is to use the effect called lateral spin transfer effect to reduce noise of magnetic origin in a magnetoresistive sensor.

The lateral spin transfer effect, also called self-torque in the literature, has been described in the article by M. D. Stiles et al. entitled "Phenomenological theory of current-induced magnetization precession" published in Phys. Rev. B. Vol. 69, 054408 (2004), and in the article by M. L. Polianski et al. entitled "Current-induced transverse spin wave instability in a thin nanomagnet" published in Phys. Rev. Lett. Vol. 92, Number 2, 026602 (2004).

Figure 3A:
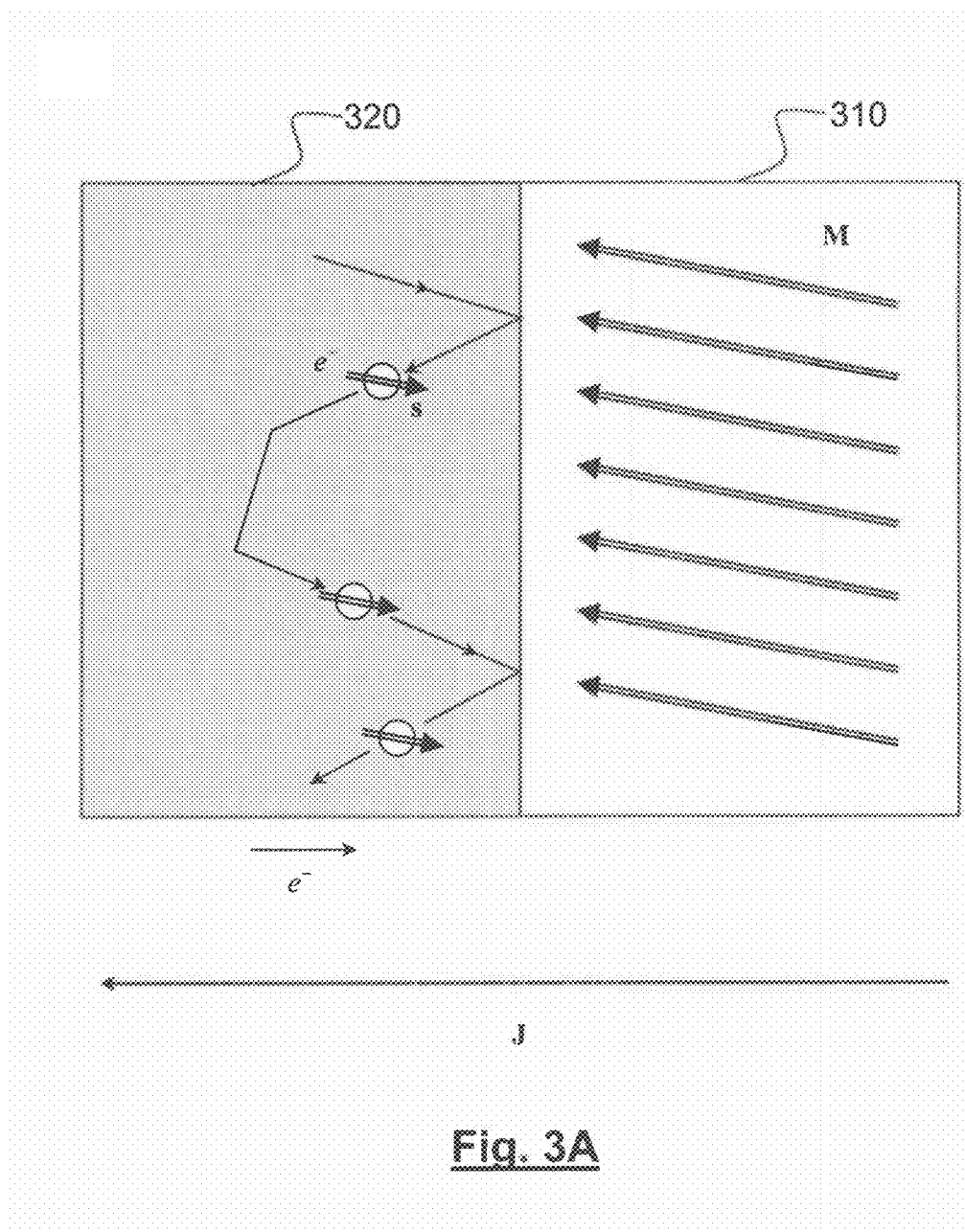
FIGS. 3A to 3D schematically illustrate the lateral spin transfer effect in a magnetic layer.
Figure 3B:
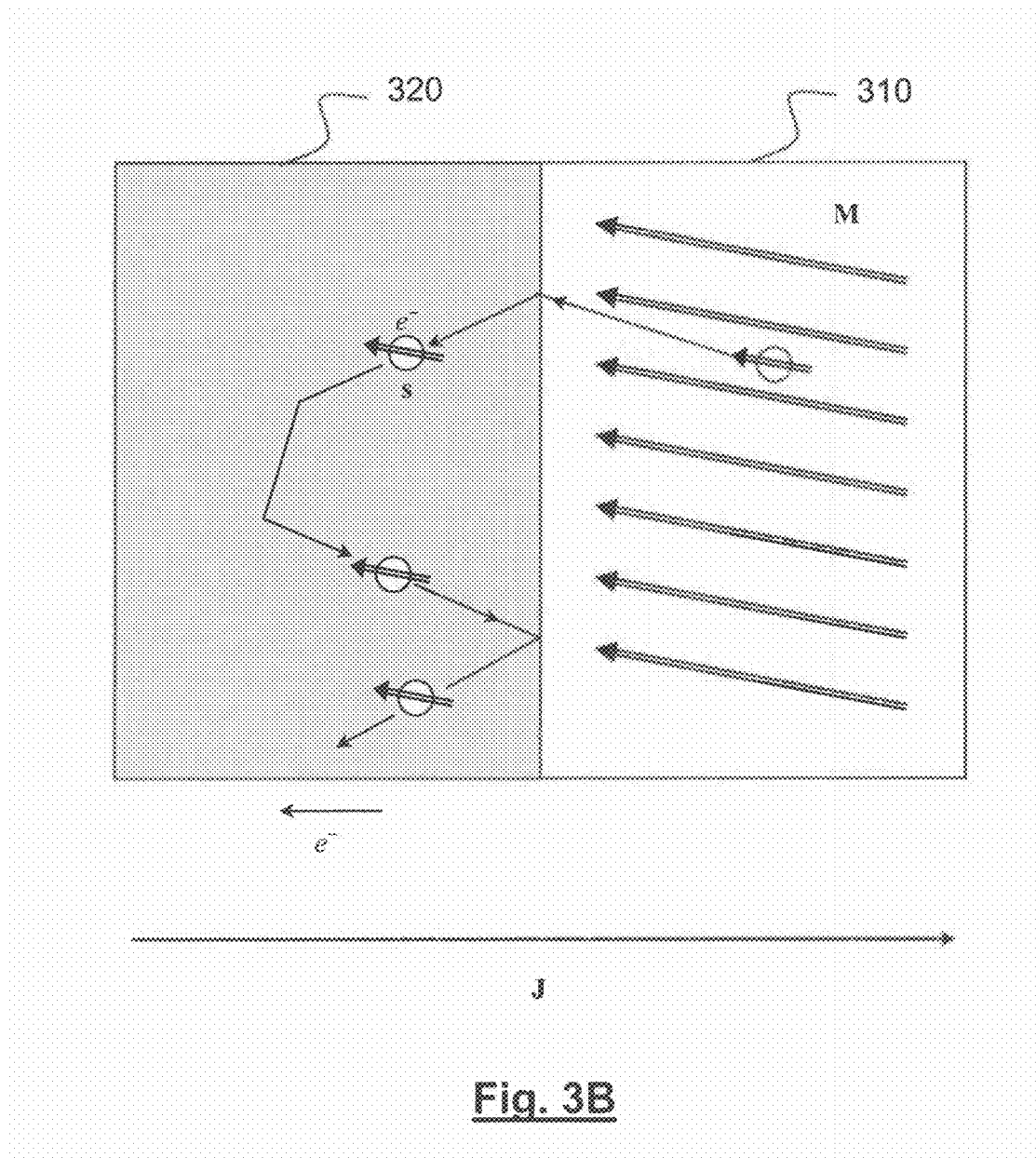
Figure 3C:
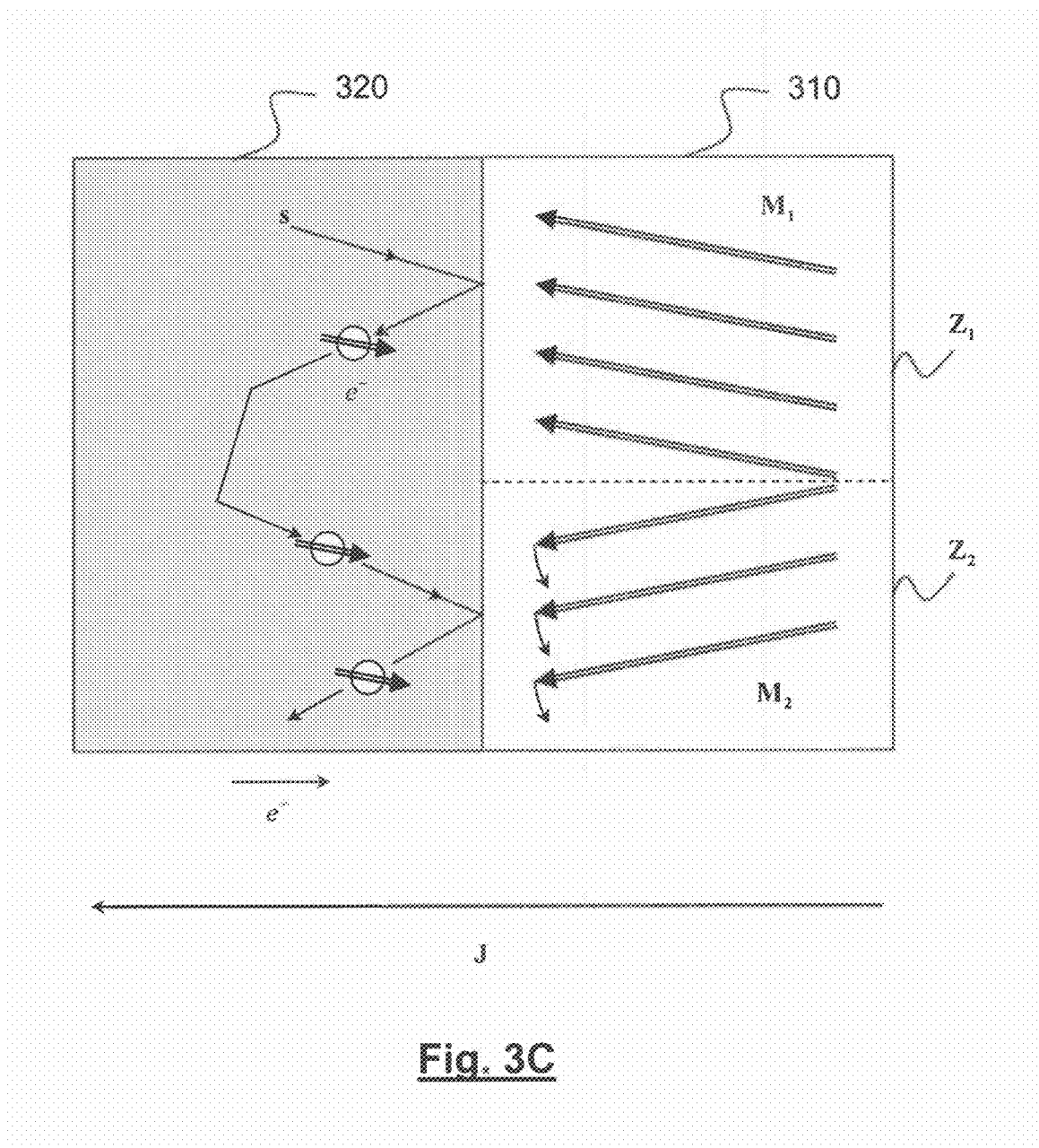

FIGS. 3A to 3C schematically illustrate the lateral spin transfer phenomenon. These figures show the interface between the'free magnetic layer, or sensitive layer 310, and a nonmagnetic metal layer 320.

Figure 3D:
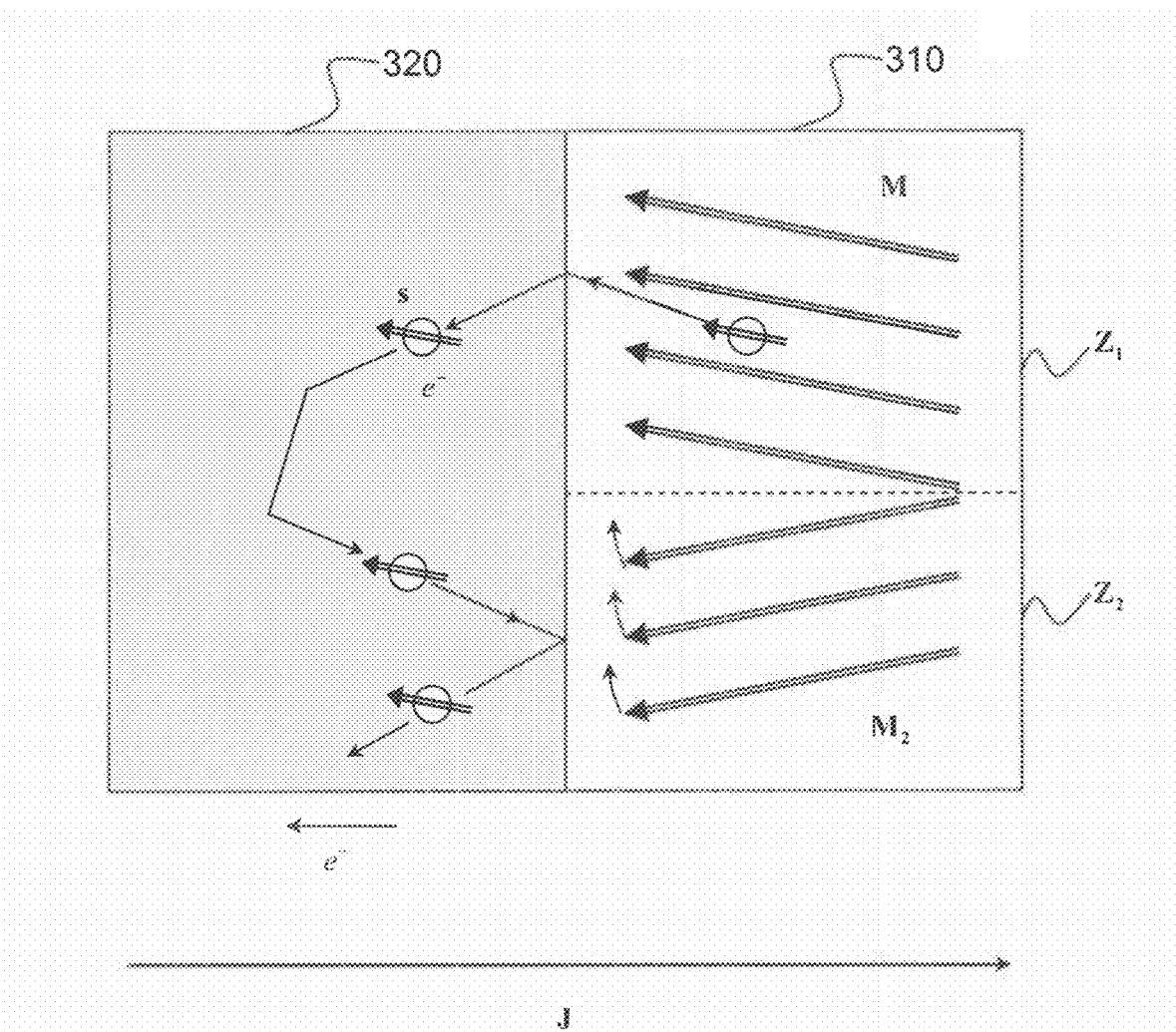

A distinction is made between the case in which the magnetization M in the sensitive layer is presumed to be perfectly uniform in FIGS. 3A and 3B, and where it presents fluctuations in FIGS. 3C and 3D.

In FIGS. 3A and 3C, a spin current flows from the sensitive layer to the nonmagnetic layer, that is the electrons go from the nonmagnetic layer to the sensitive layer. On the contrary, in FIGS. 3B and 3D, a spin-polarized current flows from the nonmagnetic layer to the sensitive layer, that is the electrons go from the sensitive layer to the nonmagnetic layer.

In the configuration of FIG. 3A, the electrons issuing from the nonmagnetic layer and having a spin s antiparallel to the magnetization M are reflected by the sensitive layer. The reflected electrons are then sidescattered and are again returned to the interface by the electric field, while retaining their spin direction. Their interaction with the magnetization of the sensitive layer is consequently laterally invariant. The equilibrium of the sensitive layer is nevertheless unstable as shown below in FIG. 3C.

In the configuration of FIG. 3B, the electrons issuing from the sensitive layer have their spins s polarized along the magnetization direction M and penetrate into the nonmagnetic layer under the action of the electric field. Some of these electrons, in their Brownian motion, are backscattered to the interface but, since their spins remain parallel to M, their interaction with the sensitive layer is laterally invariant.

In the configuration of FIG. 3C, an electron issuing from the nonmagnetic layer having a spin s antiparallel to the local magnetization $M_1$ of a first zone $Z_1$ of the sensitive layer is reflected at the interface, and then sidescattered before returning to another zone $Z_2$ of the sensitive layer having a local magnetization $M_2$, having a distinct orientation from that of $M_1$. Its spin s is reoriented to be antiparallel to $M_2$, by transferring its magnetic moment to the sensitive layer. This transfer accentuates the disorientation of $M_2$ with regard to $M_1$. The lateral spin effect destabilizes the sensitive layer by increasing the fluctuations of its magnetization.

Conversely, in FIG. 3D, an electron issuing from a first zone $Z_1$ of the sensitive layer, polarized along the local magnetization $M_1$ of this zone, has a non-negligible probability, in its Brownian motion, of being backscattered to the interface in the nonmagnetic layer. If it returns to a zone $Z_2$ of the sensitive layer having a local magnetization $M_2$, distinct from $M_1$, its spin s is oriented to be parallel to $M_2$, by transferring its magnetic moment to the sensitive layer. This transfer is equivalent to a torque which tends to align the magnetization $M_2$ in the direction of $M_1$. In this case, the lateral spin transfer effect stabilizes the sensitive layer by rendering its magnetization uniform.

The lateral spin transfer effect is a spin transfer exerted by the sensitive layer on itself, thanks to the lateral coupling exerted by the electrons having passed through or having been reflected by the interface.

Figure 4:
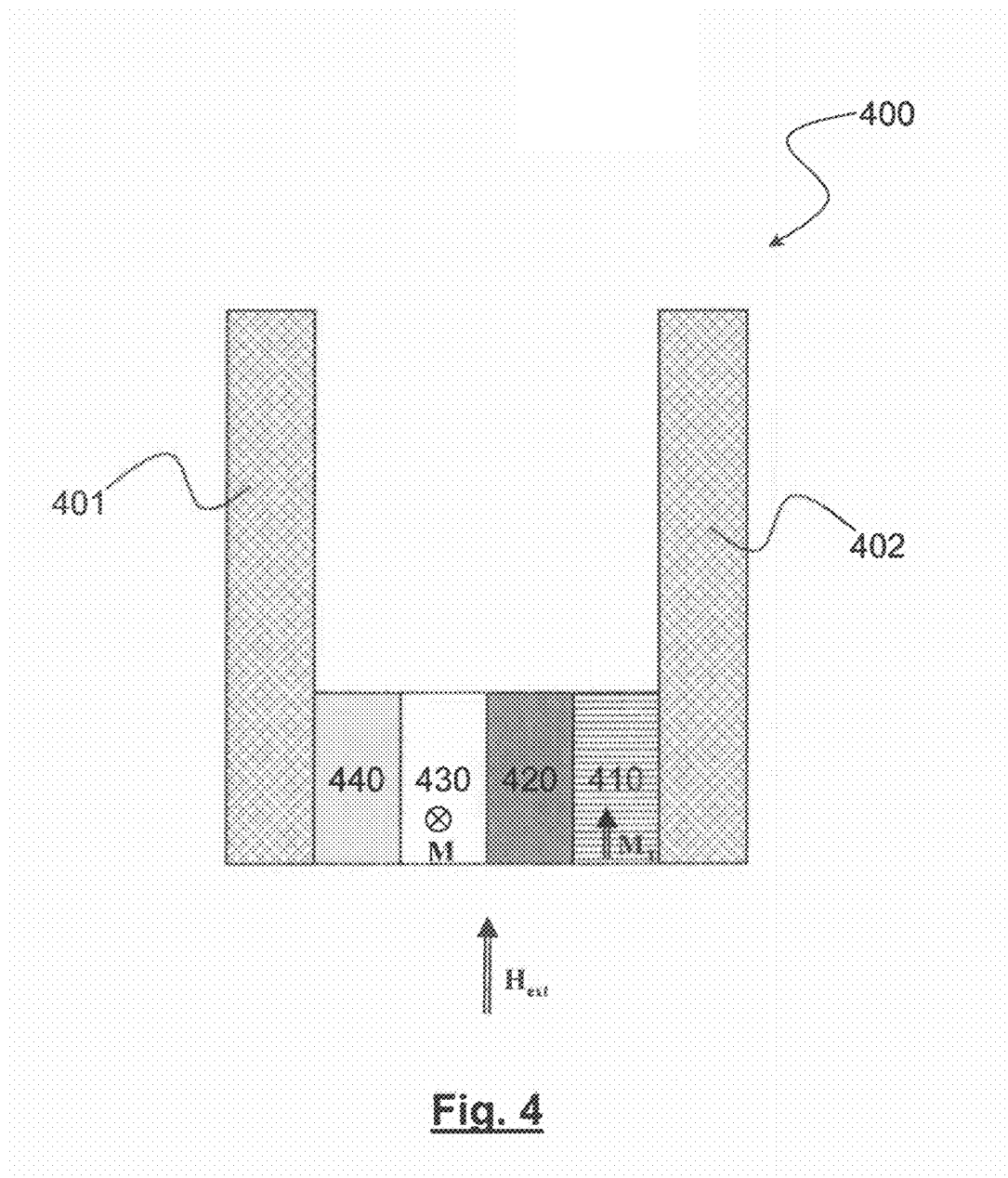
FIG. 4 schematically illustrates a magnetoresistive sensor according to the invention.

FIG. 4 illustrates the structure of a sensor according to the invention.

The sensor 400 comprises two metal screens 401 and 402 serving on the one hand to bound the magnetic field measurement zone, and on the other, to input a continuous current and to measure the measurement voltage.

As in the prior art, it also comprises a first magnetic layer 410, of which the magnetization is pinned by an antiferromagnetic layer (not shown), and a free magnetic layer 430, constituting the sensitive layer. A nonmagnetic separating layer 420 serves for uncoupling the pinned layer and the sensitive layer. The separating layer may be a metal layer, typically of Cu, optionally arranged in a sandwich with a discontinuous oxide layer to confine the current paths, or a fine insulating layer, for example of alumina or magnesium (MgO). This respectively produces a spin valve, a current confinement spin valve, or a magnetic tunnel junction.

The antiferromagnetic layer may consist of an alloy IrMn, PtMn, PtPdMn. The pinned layer is, for example, a single layer of CoFe 3 nm or is part of a synthetic antiferromagnetic structure CoFe/Ru/CoFe as shall be shown below.

The first pinned magnetic layer 410 has a magnetization $M_T$ oriented along a fixed direction, substantially parallel to the direction of the magnetic field $H_{ext}$ to be measured. In the absence of an applied magnetic field, the free magnetic layer has a magnetization M in the plane thereof, substantially orthogonal to the magnetization of the first layer. This orthogonal orientation can be obtained by applying a bias magnetic field by means of a pair of lateral permanent magnets, for example made from alloy CoCr, located on either side of the magnetoresistive element. Alternatively, in the case in which this element is a tunnel junction, the orthogonal orientation of the magnetization of the free layer can be obtained by a permanent magnet layer located in the stack (in-stack bias) between the tunnel junction and the metal screens serving to convey the current. The magnetization of the permanent magnet layer is selected in the plane of the layers and orthogonal to that of the pinned layer. By partially closing through the free layer of the tunnel junction, the magnetic field generated by the permanent magnet layer polarizes the free layer in the desired direction.

The choice of an orthogonal polarization in the sensitive layer serves to obtain a linear response of the sensor, the magnetoresistance of the spin valve or of the tunnel junction varying as the cosine of the angle between the magnetizations of the sensitive layer and the pinned layer.

Unlike the prior art, the sensor 400 further comprises a second layer 440, called below a lateral coupling layer, suitable for controlling the lateral spin transfer effect on the sensitive layer.

According to a first embodiment, the sensor comprises means (for example, a current source, not shown) for circulating a continuous current from the lateral coupling layer to the pinned layer, that is the electrons go from the sensitive layer to the lateral coupling layer as in FIG. 3D.

Figure 1:
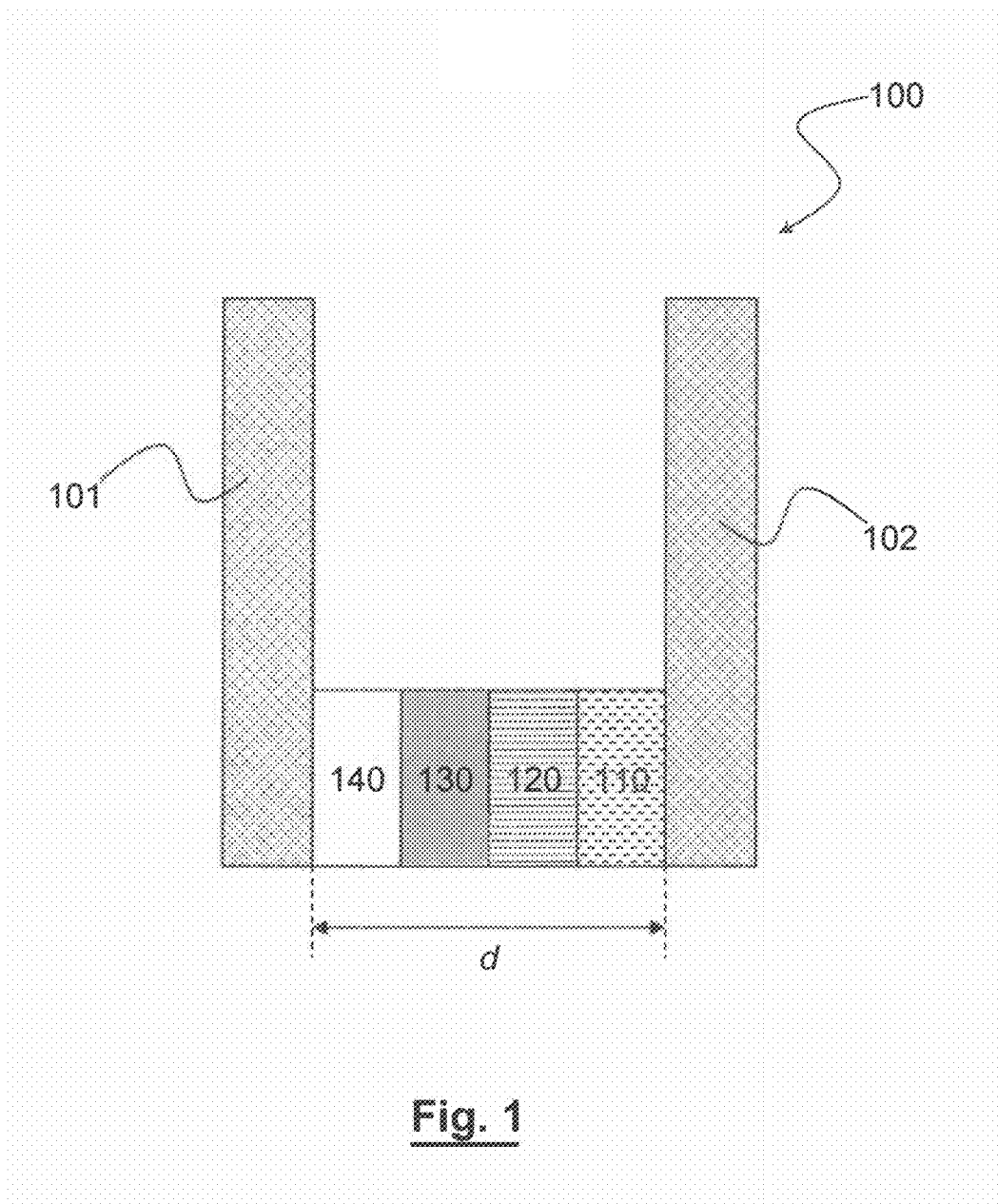
FIG. 1 schematically shows a magnetoresistive sensor with a spin valve in a CPP configuration, known in the prior art.
Figure 2:
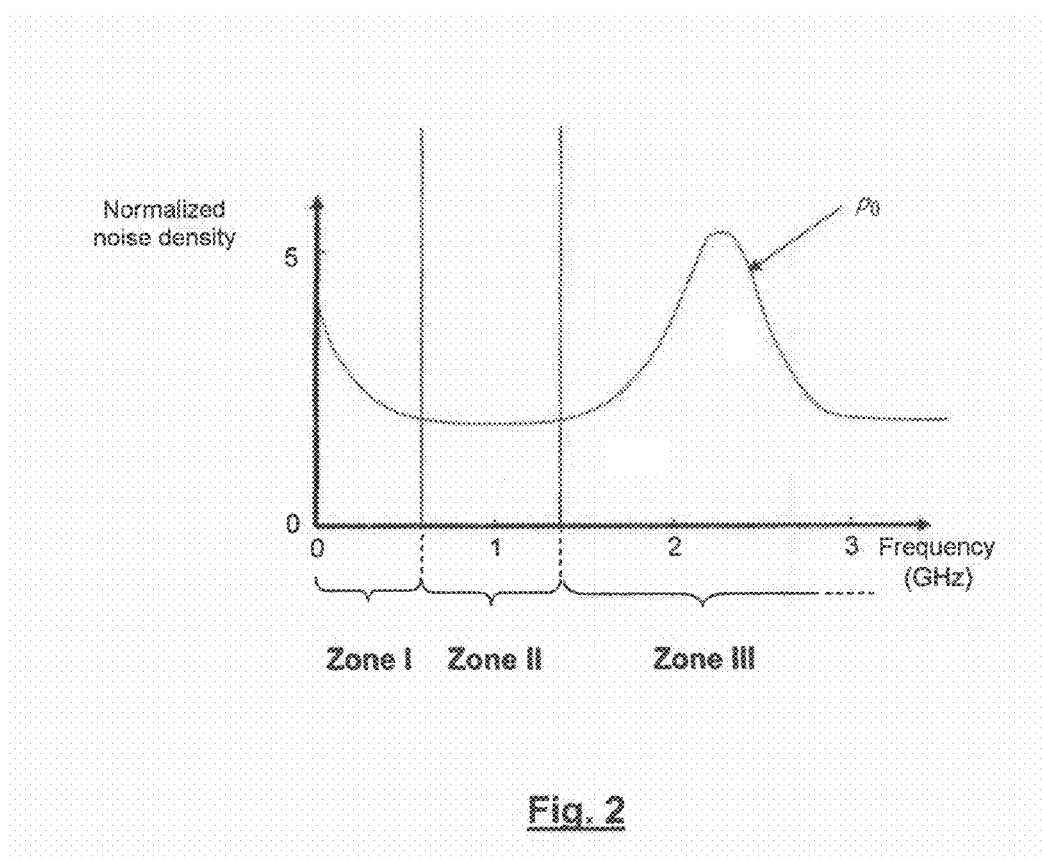
FIG. 2 shows the noise density affecting the measurement signal in the magnetoresistive sensor in FIG. 1.

According to the first embodiment, the lateral coupling layer is suitable for favoring the backscattering of the electrons to the sensitive layer with conservation of spin during this backscattering. In general, the lateral coupling layer 440 comprises a backscattering layer 445, possibly incorporated in or added to a metal layer 443, as shown respectively in FIGS. 5A and 5B. The lateral spin effect stabilizes the magnetization of the sensitive layer and the noise of magnetic origin in the sensor is consequently reduced when it is used in the zone (I) in FIG. 2.

The choice of the lateral coupling layer depends on the nature of the separating layer 420. In fact, the resistance of the lateral coupling layer is in series with the magnetoresistance of the pinned layer/separating layer/sensitive layer stack (spin valve or tunnel junction). As it happens, the resistance of the coupling layer is substantially independent of the measured magnetic field, thereby reducing the relative variation in resistance $\Delta R/R$ of the sensor and hence its sensitivity. Thus advantageously, a lateral coupling layer having a resistance substantially lower than that of the pinned layer/separating layer/sensitive layer stack is selected.

For example, if the separating layer is a tunnel barrier, the backscattering layer 445 may be according to each case:
  a) a second thinner tunnel barrier and/or one having a lower barrier height than the first tunnel, insulating or semiconducting barrier;
  b) a current confinement layer, that is a discontinuous insulating layer suitable for confining the current paths;
  c) a metal layer with a higher resistivity than the metal layer 443, directly in contact with the sensitive layer.

The surface resistivity of the second tunnel barrier/current confinement layer is selected to be substantially lower than that of the first tunnel barrier.

If the separating layer is a current confinement layer, the backscattering layer 445 may be according to each case:
  a) a very thin tunnel, insulating or semiconducting barrier;
  b) a second current confinement layer;
  c) a metal layer having a higher resistivity than the metal layer 443, directly in contact with the sensitive layer.

The surface resistivity of the tunnel barrier/second current confinement layer is selected to be substantially lower than that of the first current confinement layer.

Finally, if the separating layer is a metal layer, the backscattering layer 445 is preferably a metal layer having a higher resistivity than the metal layer 443, which incorporates it or which is added to it, and which is directly in contact with the sensitive layer.

For the electrons to conserve their spin as much as possible during their backscattering movement, it is necessary to avoid introducing, into the lateral coupling layer, elements tending to produce a spin flip, such as Pd, Pt, Mn, Au.

According to a second embodiment of the invention, the sensor comprises means (for example, a current source not shown) for circulating a continuous current from the pinned layer to the lateral coupling layer, that is the electrons go from the lateral coupling layer to the sensitive layer as in FIG. 3C.

According to the second embodiment, the lateral coupling layer is suitable for reducing the sidescattering of the electrons (reflected by the sensitive layer) and/or for producing a loss of spin memory of the backscattered electrons. In this way, the magnetization fluctuations in the sensitive layer are not amplified by the lateral spin transfer effect. This serves to maintain the noise of magnetic origin in the magnetoresistive sensor to a relatively lower level.

The choice of the lateral coupling layer also depends on the nature of the separating layer. For example, if the separating layer is a tunnel barrier or a current confinement layer, the lateral coupling layer may comprise according to each case:
  a) a layer having a high electrical resistivity, in which the electrons have a short mean free path. In the context of the present invention, short mean free path means a mean free path shorter than the characteristic lateral dimension of the uniform magnetization zones of the sensitive layer;
  b) a metal layer having a low resistivity but containing impurities causing a spin flip of the electrons.

Finally, if the separating layer is a metal layer, the lateral coupling layer may comprise a metal layer having a low resistivity containing impurities causing a spin flip.

The magnetoresistive sensor according to the invention can be produced as follows.

The method first preferably begins with the deposition of a nonmagnetic buffer layer on a current input electrode, for example one of the metal screens bounding the measurement zone. This buffer layer has the purpose of promoting the growth of the structure and may consist for example of NiFeCr 5 nm. The following are then carried out in succession:

(a) a first pinning antiferromagnetic layer, for example of PtMn, PtPdMn, or IrMn, preferably of PtMn having a thickness of 15 to 25 nm; then, either the following option (b1) or the option (b2):

(b1) a single magnetic layer directly in contact with the antiferromagnetic layer, for example a layer of CoFe alloy, rich in Co, having a typical thickness of about 3 nm. This single layer thereby constitutes the first pinned magnetic layer of the sensor according to the invention; or (b2) an artificial ferrimagnetic composite layer consisting of:
  a first pinned sub-layer in contact with the antiferromagnetic layer, for example a layer of CoFe alloy rich in Co having a typical thickness of about 3 nm;
  an Ru antiferromagnetic coupling layer having a typical thickness between 0.5 and 1 nm;
  a second pinned sub-layer which actually constitutes the pinned magnetic layer 410 of the sensor 400. This second pinned Sub-layer may consist of CoFe, rich in Co. It may also consist of CoFeB or CoFe, having a face-centered cubic structure, if the separating layer is insulating, of MgO;

(c) a nonmagnetic layer constituting the separating layer of the sensor according to the invention. It may be insulating, for example of alumina or MgO or TiOx, to produce a tunnel barrier. It may also be metallic, for example of Cu, to produce a spin valve. It may finally be a composite layer of insulation and metal, for example produced by oxidation of a fine layer of $Al_{1-x}Cu_x$ alloys with x between 0.005 and 0.05 by volume, to produce a current confinement structure;

(d) a layer of CoFe alloy, rich in Co, in particular $Co_{90}Fe_{10}$, constituting the sensitive layer of the sensor according to the invention. This layer may alternatively be formed by the combination of two Co and Fe sub-layers, having a total thickness of 1 nm, directly in contact with the first separating layer, followed by a NiFe 3 nm layer to increase the magnetic softness of the preceding layer.

However, if the first underlying separating layer is of MgO with a face-centered cubic structure, it is preferable to use a CoFe alloy having the same structure or an amorphous CoFeB alloy which can then be annealed. Lattice mismatches at the interface are thereby avoided;

(e) a lateral coupling layer of which the composition is distinguished according to the embodiment of the invention.

In the case of the first embodiment, the composition of the coupling layer depends, as previously demonstrated, on the nature of the separating layer.

If the separating layer forms a tunnel barrier, the lateral coupling layer may comprise, according to each case:

$e_1$) a second very thin tunnel barrier, for example an insulating layer of the same material as the first tunnel barrier, but thinner, for example between 0.3 and 0.6 nm;

$e_2$) a discontinuous insulating layer, for confining the current paths, for example a layer of TiOx, or a nanolayer of nonmagnetic oxide, for example TaO. This discontinuous insulating layer may also be produced by oxidation of an alloy or of an AlCu bilayer comprising a few % of Cu;

$e_3$) a metal bilayer comprising a first sub-layer of a low resistivity metal directly in contact with the sensitive layer, and a second metal sub-layer having a higher resistivity than that of the first sub-layer, or of which the interface with the first sub-layer has a high resistivity or a potential step for the electrons, for example a first sub-layer of Cu and a second sub-layer of Ta, Ru, Cr, Zr, Nb, Mo, Hf, W or Re.

If the separating layer is a current confinement layer, the lateral coupling layer may also be according to one of the preceding options ($e_1$),($e_2$) or ($e_3$). For the options ($e_1$) and ($e_2$), the tunnel barrier/second confinement layer must have a lower resistivity than that of the first current confinement layer.

If the separating layer is a metal layer, the lateral coupling layer will preferably comprise a first metal sub-layer having a low resistivity directly in contact with the sensitive layer, and a second metal sub-layer having a higher resistivity than the first or of which the interface with the first sub-layer has a higher resistance or a potential step for the electrons. For example, the first sub-layer may be of Cu and the second sub-layer of Ta, Ru, Cr, Zr, Nb, Mo, Hf, W or Re.

In the case of the second embodiment, the composition of the coupling layer depends, as previously demonstrated, on the nature of the separating layer.

If the separating layer is a tunnel barrier or a current confinement layer, the lateral coupling layer may comprise one or the other of the two options below (e4 and e5):

$e_4$) a layer having a high electrical resistivity and a thickness of 0.2 nm to a few nm. This layer may for example be of Ta, Ru, Cr or of NiFeCr or NiCoFeCr alloys, conferring a short mean free path to the electrons. This layer may also consist of a lamination of atomic monolayers of Ta and Cu;

$e_5$) a metal layer having a low resistivity but containing impurities causing a spin flip of the electrons. As impurities, use can be made of magnetic ions such as Mn, and/or elements having a high spin-orbit coupling, such as Pd, Ru, Pt, Hf, Ta, W, Re, Ir, Au.

These two options may also be combined by the addition, in a high resistivity layer as described in option ($e_4$), of impurities causing a spin flip of the electrons as indicated in the option ($e_5$).

Finally, if the separating layer is metallic, the lateral coupling layer will then be produced as in the option ($e_5$) above.

The invention claimed is:

1. A magnetoresistive sensor comprising;
a first pinned-magnetization magnetic layer;
a free-magnetization magnetic layer with a magnetization, in an absence of an external magnetic field, that is substantially orthogonal to a magnetization of the first pinned-magnetization magnetic layer;
a first separating layer that separates and magnetically uncouples the first pinned-magnetization layer and the free-magnetization magnetic layer;
a lateral coupling layer, located on a side of the free-magnetization magnetic layer opposite that of the first separating layer, wherein the lateral coupling layer causes a backscattering of electrons, with conservation of spin, to the free-magnetization magnetic layer, and said backscattering aligns a second local magnetization direction within a second part of the free-magnetization magnetic layer with a first local magnetization direction within a first part of the free-magnetization magnetic layers; and
a current source that circulates a continuous current from the lateral coupling layer to the first pinned-magnetization magnetic layer.

2. The magnetoresistive sensor as claimed in claim 1, wherein the first separating layer is a first insulating layer, forming a first tunnel barrier.

3. The magnetoresistive sensor as claimed in claim 2 wherein the lateral coupling layer comprises a second insulating or semiconducting layer forming a second tunnel barrier and having a surface resistivity lower than that of the first separating layer.

4. The magnetoresistive sensor as claimed in claim 3, wherein the lateral coupling layer comprises the second insulating layer, and the second insulating layer consists of alumina, MgO, or $TiO_x$.

5. The magnetoresistive sensor as claimed in claim 2, further comprising a metal layer, directly in contact with the free-magnetization magnetic layer, said metal layer incorporating or being joined to another metal layer having a higher resistivity than the second metal layer.

6. The magnetoresistive sensor as claimed in claim 5, wherein the metal layer consists of Cu and the another metal layer belongs to the group consisting of Ta, Ru, Cr, Zr, Nb, Mo, Hf, W, Re.

7. The magnetoresistive sensor as claimed in claim 1, wherein the first separating layer is a first discontinuous insulating layer that confines current passing through it along a plurality of current paths.

8. The magnetoresistive sensor as claimed in claim 7, wherein the lateral coupling layer comprises a second discontinuous insulating layer that confines current passing through it and has a surface resistivity lower than that of the first separating layer.

9. The magnetoresistive sensor as claimed in claim 3 or 8, wherein the second insulating layer consists of $TiO_x$ or a monolayer of TaO.

10. The magnetoresistive sensor as claimed in claim 8, wherein the second insulating layer is produced by oxidation of an alloy or of an AlCu bilayer.

11. The magnetoresistive sensor as claimed in claim 1, wherein the first separating layer is a first nonmagnetic metal layer.

12. The magnetoresistive sensor as claimed in claimed 1, further comprising;
a synthetic ferrimagnetic layer, consisting of first and second magnetic sub-layers containing an antiferromagnetic coupling sub-layer in a sandwich, the first magnetic sub-layer being pinned by a pinning antiferromagnetic layer, the second magnetic sub-layer constituting said first pinned-magnetization magnetic layer.

13. The magnetoresistive sensor as claimed in claim 12, wherein the synthetic ferrimagnetic layer is CoFe/Ru/CoFe, where the CoFe magnetic sub-layers have a thickness between 1 and 5 nm and the Ru antiferromagnetic coupling layer has a thickness of 0.5 to 1 nm.

14. The magnetoresistive sensor as claimed in claim 12, wherein the synthetic ferrimagnetic layer is CoFe/Ru/CoFeB or CoFe/Ru/CoFe where the CoFe and CoFeB magnetic sub-layers have a thickness between 1 and 5 nm and the Ru antiferromagnetic coupling sub-layer has a thickness of 0.5 to 1 nm and the second magnetic sub-layer consists of CoFeB or CoFe alloy with a face-centered cubic structure.

15. The magnetoresistive sensor as claimed in claim 12, wherein the pinning antiferromagnetic layer consists of PtMn, PtPdMn, or IrMn.

16. The magnetoresistive sensor as claimed in claim 15, wherein the pinning antiferromagnetic layer consists of PtMn with a thickness of 15 to 25 nm.

17. The magnetoresistive sensor as claimed in claim 1, wherein the free-magnetization magnetic layer consists of CoFe alloy.

18. The magnetoresistive sensor as claimed in claim 1, wherein the free-magnetization magnetic layer consists of two sub-layers, one of Co or CoFe, alloy, having a thickness of 0.5 nm to 2 nm, directly at the interface with the separating layer, and the other of NiFe having a thickness of 1.5 to 5 nm.

19. A magnetoresistive sensor comprising:
a first pinned-magnetization magnetic layer
a free-magnetization magnetic layer with a magnetization, in an absence of an external field, that is substantially orthogonal to a magnetization of the first pinned-magnetization magnetic layer;
a first separating layer that separates and magnetically uncouples the first pinned-magnetization layer and the free-magnetization magnetic layer;
a lateral coupling layer, located on a side of the free-magnetization magnetic layer opposite that of the separating layer and that reduces the sidescattering of the electrons and/or produces a loss of spin memory; and
a current source that circulates a continuous current from the first pinned-magnetization magnetic layer to the lateral coupling layer,
wherein the lateral coupling layer has a high resistivity, such that a mean free path of the electrons in said lateral coupling layer is shorter than a characteristic lateral dimension of uniform magnetization zones of the free-magnetization magnetic layer.

20. The magnetoresistive sensor as claimed in claim 19, wherein the first separating layer is a first insulating layer, forming a first tunnel barrier.

21. The magnetoresistive sensor as claimed in claim 20, wherein the lateral coupling layer is a metal layer having a low resistivity and comprises impurities that cause a spin flip.

22. The magnetoresistive sensor as claimed in claim 21, wherein the metal layer has a lower resistivity than that of the first non-magnetic metal layer.

23. The magnetoresistive sensor as claimed in claim 21, wherein said impurities belong to a group consisting of Mn, Pd, Ru, Pt, Hf, Ta, W, Re, Ir, Pt, Au.

24. The magnetoresistive sensor as claimed in claim 2 or 20, wherein the first separating layer consists of alumina, MgO, or $TiO_x$.

25. The magnetoresistive sensor as claimed in claim 19, wherein the first separating layer is a first discontinuous insulating layer suitable for confining the current passing through it along a plurality of current paths.

26. The magnetoresistive sensor as claimed in claim 19, wherein the first separating layer is a first nonmagnetic metal layer.

27. The magnetoresistive sensor as claimed in claim 11 or 26, wherein the first non-magnetic metal layer consists of Cu.

28. The magnetoresistive sensor as claimed in claim 19, wherein the lateral coupling layer consists of Ta, Ru or Cr.

29. The magnetoresistive sensor as claimed in claim 19, wherein the lateral coupling layer consists of NiFeCr or NiCoFeCr alloy.

30. The magnetoresistive sensor as claimed in claim 19, wherein the lateral coupling layer consists of a lamination of atomic monolayers of Ta and Cu.

* * * * *